United States Patent
Zama et al.

(10) Patent No.: US 6,750,680 B2
(45) Date of Patent: Jun. 15, 2004

(54) SEMICONDUCTOR INTEGRATED CIRCUIT, LOGIC OPERATION CIRCUIT, AND FLIP FLOP

(75) Inventors: Hidemasa Zama, Kawasaki (JP); Masayuki Koizumi, Yokohama (JP); Yukiko Ito, Yokosuka (JP); Kimiyoshi Usami, Yokohama (JP); Naoyuki Kawabe, Kawasaki (JP); Masahiro Kanazawa, Yokohama (JP); Toshiyuki Furusawa, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/883,959

(22) Filed: Jun. 20, 2001

(65) Prior Publication Data
US 2002/0008545 A1 Jan. 24, 2002

(30) Foreign Application Priority Data
Jun. 20, 2000 (JP) .................. 2000-184398

(51) Int. Cl.⁷ ............................. H03K 19/096
(52) U.S. Cl. ............... 326/98; 326/95; 326/121; 327/199; 327/208; 327/212
(58) Field of Search ............ 326/93, 95, 98, 326/46, 121; 327/208–212, 214, 215, 224, 225; 365/154, 156

(56) References Cited

U.S. PATENT DOCUMENTS

| | | | | |
|---|---|---|---|---|
| 5,781,062 A | * | 7/1998 | Mashiko et al. | |
| 5,821,778 A | * | 10/1998 | Bosshart | 326/95 |
| 6,034,563 A | * | 3/2000 | Mashiko | |
| 6,208,170 B1 | * | 3/2001 | Iwaki et al. | 326/121 |
| 6,231,147 B1 | * | 5/2001 | Bosshart | 327/202 |
| 6,288,586 B1 | * | 9/2001 | Ahn et al. | 327/199 |

FOREIGN PATENT DOCUMENTS

| | | | | |
|---|---|---|---|---|
| DE | 199 00 859 | * | 7/1999 | |
| EP | 0 863 461 | * | 9/1998 | |
| EP | 0 949 629 | * | 10/1999 | |
| JP | 629834 | * | 6/1994 | ....... H03K/19/0948 |
| JP | 7114798 | | 5/1995 | |
| JP | 11-195976 | * | 7/1999 | |
| JP | 2000-197270 | | 7/2000 | |
| JP | 2000-295234 | | 10/2000 | |

OTHER PUBLICATIONS

K. Fujii, et al., Solid–State Circuits Conference, 1998. Digest of Technical Papers, pp. 190–191, XP–010278580, "A Sub–1V Triple Threshold CMOS/SIMOX Circuit for Active Power Reduction", Feb. 5, 1998.

N. Shibata, et al., IEEE Journal of Solid–State Circuits, vol. 34, No. 6, pp. 866–877, XP–000913041, "A 1–V, 10–MHz, 3.5–mW, 1Mb MTCMOS SRAM with Charge–Recycling Input/Output Buffers", Jun. 1999.

* cited by examiner

*Primary Examiner*—Vibol Tan
(74) *Attorney, Agent, or Firm*—Oblon, Spivak, McClelland, Maier & Neustadt, P.C.

(57) ABSTRACT

There is provided a semiconductor integrated circuit, a logic operation circuit and a flip flop capable of operating at a high speed and having a leak electric current reduced.

In a semiconductor integrated circuit according to the present invention, only a gate circuit on a critical path is constituted by an MT gate cell obtained by combining transistors having a low threshold voltage with transistors having a high threshold voltage, and any other gate circuit is constituted by a transistor having a high threshold voltage. Consequently, the gate circuit on the critical path can be operated at a high speed, and the overall leak electric current can be suppressed, thereby reducing the consumption power.

13 Claims, 6 Drawing Sheets

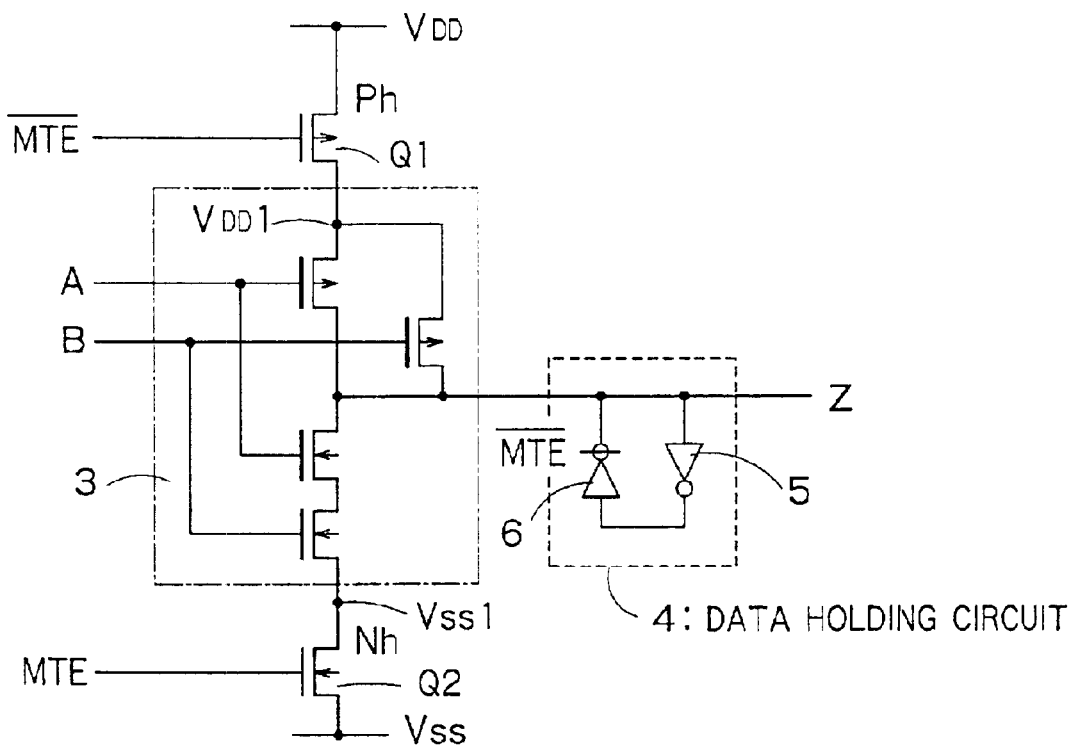
F I G. 5

SEMICONDUCTOR INTEGRATED CIRCUIT, LOGIC OPERATION CIRCUIT, AND FLIP FLOP

CROSS REFERENCE TO RELATED APPLICATIONS

This application claims benefit of priority under 35USC §119 to Japanese Patent Application No. 2000-184398, filed on Jun. 20, 2000, the entire contents of which are incorporated by reference herein.

BACKGROUND OF THE INVENTION (i) Field of the Invention

The present invention relates to a semiconductor integrated circuit constituted by combining a plurality of transistors, a logic operation circuit, and a flip flop, and more particularly to a technique for reducing consumption power and improving a signal transmission rate.

(ii) Description of the Related Art

In order to increase the speed of a CMOS logic circuit, the circuit must be constituted by transistors with a low threshold voltage. However, when the threshold voltage of the transistors lowers, a leak electric current increases at the time of standby. To avoid this problem, there is proposed an MT (Multiple Threshold voltage)-CMOS circuit which can simultaneously achieve the high-speed operation of the circuit and the low leak electric current at the time of standby.

FIG. 9 is a conventional circuit diagram of the MT-CMOS circuit. The circuit shown in FIG. 9 includes a Low-Vth block 1 which is connected between a virtual power supply line VDD1 and a virtual ground line VSS1 and constituted by a plurality of transistors having a low threshold voltage, a transistor Q1 which is connected between the virtual power supply line VDD1 and a power supply line VDD and has a high threshold voltage, and a transistor Q2 which is connected between the virtual ground line VSS1 and a ground line VSS and has a low threshold voltage.

In the operation (active), the both transistors Q1 and Q2 are turned on, and a power supply voltage is supplied to the Low-Vth block 1. Since the Low-Vth block 1 is constituted by a transistor having a low threshold voltage, it operates at a high speed.

On the other hand, in the standby mode, the both transistors Q1 and Q2 are turned off, and a leak path extending from the power supply line to the ground line is shut off, thereby reducing the leak electric current.

However, since the ON resistance exists in the transistors Q1 and Q2 illustrated in FIG. 9, the potential of the virtual power supply line and the virtual ground line tends to be unstable in active state, and the circuit operation of the entire Low-Vth block 1 also becomes unstable.

Further, when the Low-Vth block 1 is active, since the leak electric current flows from the power supply line to the ground line through the leak path, it is difficult to reduce the leak electric current in this period. Furthermore, since a transistor having a high threshold voltage must be added besides the Low-Vth block 1, a circuit area increases, and data held in a flip flop or a latch in the Low-Vth block 1 is disadvantageously lost in the standby mode.

On the other hand, in order to minimize these problems, there is proposed such a circuit as shown in FIG. 10 in which only some cells in the logic circuit are replaced with transistors having a low threshold voltage. A heavy line in FIG. 10 indicates a cell constituted by using transistors having a low threshold voltage.

However, when each of some cells is constituted by transistors having a low threshold voltage as shown in FIG. 10, since the leak electric current flows to this cell, it is impossible to satisfy a demand to reduce the consumption power as much as possible in the standby mode (waiting period) as in a mobile phone and the like.

SUMMARY OF THE INVENTION

In view of the above-described problems, it is an object of the present invention to provide a semiconductor integrated circuit, a logic operation circuit and a flip flop capable of performing high-speed operation and have a leak electric current reduced.

To achieve this object, according to the present invention, there is provided a semiconductor integrated circuit comprising: a plurality of gate circuits; and a control circuit configured to control the operation of some gate circuits among the plurality of gate circuits, each of some gate circuits among the plurality of gate circuits including: a logic circuit constituted by a plurality of first transistors; and a switch circuit which can switch whether a power supply voltage is supplied to the logic circuit, is constituted by a second transistor having a threshold voltage higher than that of the first transistor, and is controlled by the control circuit.

According to the present invention, since only some gate circuits in the semiconductor integrated circuit are constituted by using transistors having a low threshold voltage, the speed of, e.g., only a part that accurate timing is required can be increased by using the transistors having a low threshold voltage, and any other part can be constituted by using the transistors having a reduced leak electric current and a high threshold voltage. As a result, both increase in speed and reduction in consumption power can be achieved.

Moreover, all the gate circuits in the semiconductor integrated circuit are constituted by transistors having a high threshold voltage and a low threshold voltage in the conventional MT-CMOS circuit, whereas only part of the gate circuits (for example, only a gate circuit on a critical path) is constituted by transistors having a high threshold voltage and a low threshold voltage in the present invention. Therefore, a device forming area of the circuit can be reduced as compared with the prior art MT-CMOS circuit, thereby attaining high integration.

In addition, according to the present invention, there is provided a logic operation circuit comprising: a gate circuit constituted by a plurality of first transistors; and a second transistor which is connected between a second reference voltage line and the virtual voltage line and has a threshold voltage higher than that of the first transistor, a source/drain terminal of the first transistor in the gate circuit being connected to either a source/drain terminal of another first transistor in the gate circuit or an output terminal of the gate circuit.

Additionally, according to the present invention, there is provided a logic operation circuit comprising: a gate circuit which is connected between a first reference voltage line and a virtual voltage line and constituted by a plurality of first transistors; and a second transistor which is connected between the virtual voltage line and a second reference voltage line and has a threshold voltage higher than that of the first transistor; and a third transistor which is connected between the first reference voltage line and an output terminal of the gate circuit and has a threshold voltage higher than that of the first transistor, the second and third transistors being on/off-controlled in such a manner that one of them is turned on while the other is turned off and vice versa.

Further, according to the present invention, there is provided a logic operation circuit comprising: a gate circuit constituted by a plurality of first transistors and connected to first and second virtual voltage lines; a second transistor which is connected between a first reference voltage line and the first virtual voltage line and has a threshold voltage higher than that of the first transistor; a third transistor which is connected between a second reference voltage line and the second virtual voltage line and has a threshold voltage higher than that of the first transistor; and a storage circuit capable of holding output logic of the gate circuit, the second and the third transistors being controlled to be OFF when the storage circuit holds the output logic of the gate circuit, and the second and third transistors being controlled to be ON when the storage circuit does not hold the output logic of the gate circuit.

Furthermore, according to the present invention, there is provided a logic operation circuit comprising: a gate circuit which is constituted by a plurality of first transistors and connected to first and second virtual voltage lines; a second transistor which is connected between a first reference voltage line and the first virtual voltage line and has a threshold voltage higher than that of the first transistor; a third transistor which is connected between a second reference voltage line and the second virtual voltage line and has a threshold voltage higher than that of the first transistor, and a bypass circuit which is connected to the gate circuit in parallel and constituted by a circuit which is substantially equal to the gate circuit by using a plurality of fourth transistors having a threshold voltage higher than that of the first transistor, the bypass circuit being connected between the first and second reference voltage lines.

BRIEF DESCRIPTION OF THE DRAWINGS

FIG. 5 is a circuit diagram showing a third concrete example of the MT gate cell;

DESCRIPTION OF THE PREFERRED EMBODIMENTS

A semiconductor integrated circuit according to the present invention will now be concretely described with reference to the accompanying drawings.

First Embodiment

A first embodiment adopts an SMT (Selective MT)-CMOS circuit system in which most of gate circuits in a semiconductor integrated circuit are constituted by transistors having a high threshold voltage and only some gate circuits are constituted by combining transistors having a high threshold voltage with transistors having a low threshold voltage, thereby increasing signal transmission rate and reducing consumption power. The gate circuit constituted by combining transistors having a high threshold voltage and transistors having a low threshold voltage will be referred to as an MT gate cell hereinafter.

Figure 1:
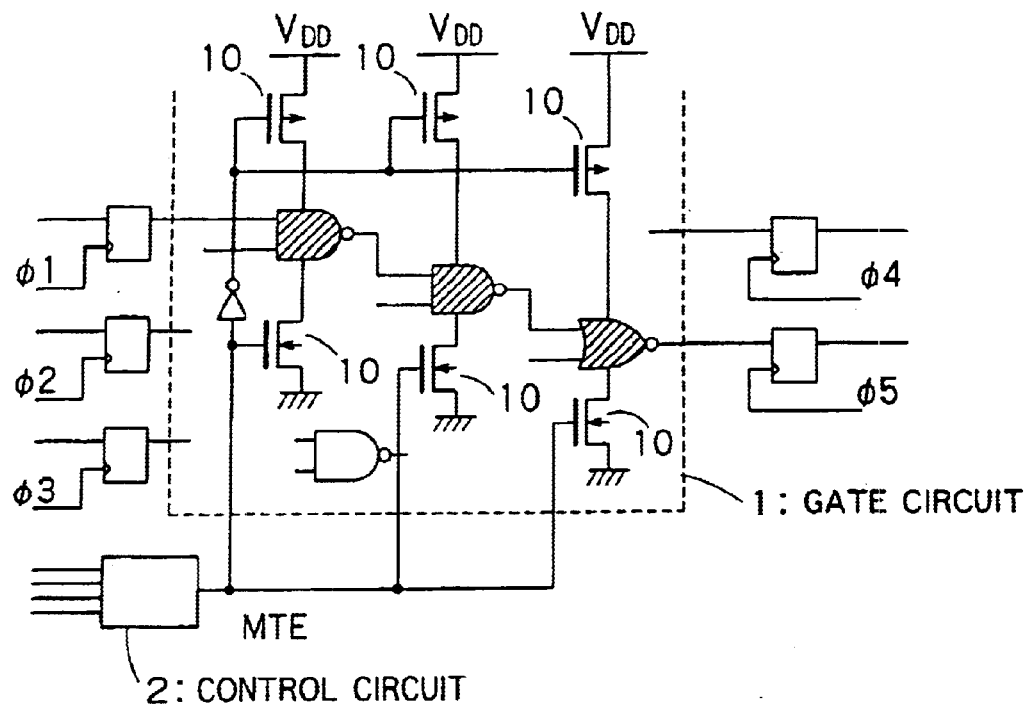
FIG. 1 is a circuit diagram showing a first embodiment of a semiconductor integrated circuit according to the present invention.

FIG. 1 is a circuit diagram of the first embodiment of the semiconductor integrated circuit according to the present invention. In the circuit depicted in FIG. 1, only the gate circuit 1 on a critical path is constituted by combining transistors having a low threshold voltage with transistors having a high threshold voltage, and any other gate circuit 1 is constituted by transistors having a high threshold voltage.

Figure 9:
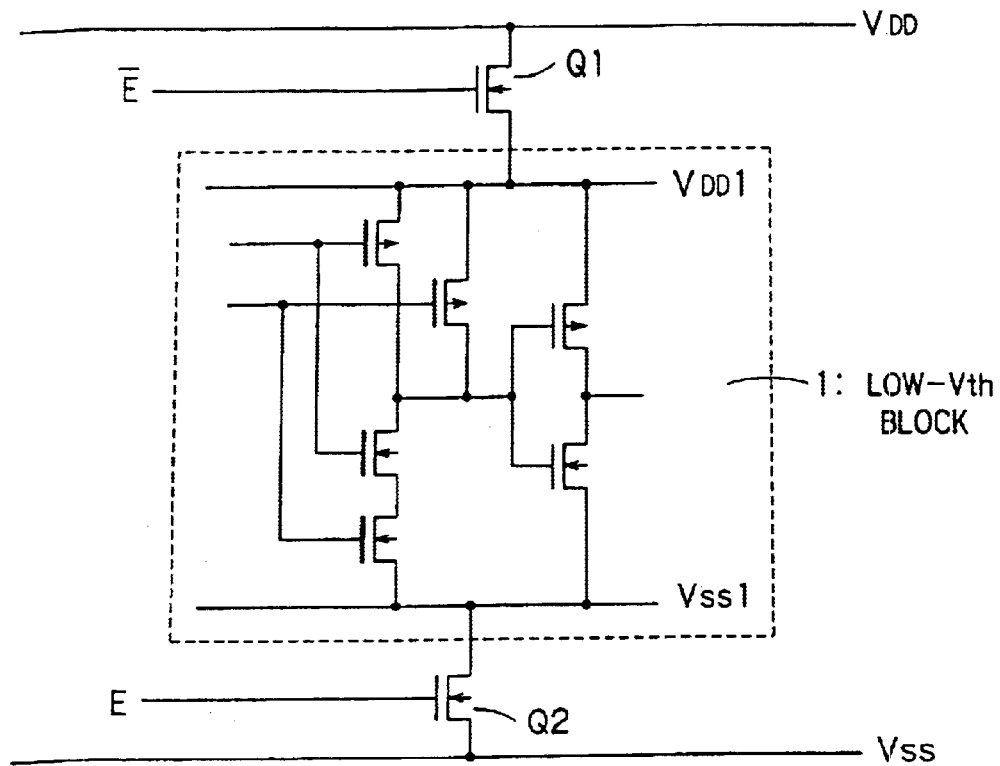
FIG. 9 is a conventional circuit diagram of an MT-CMOS circuit.
Figure 10:
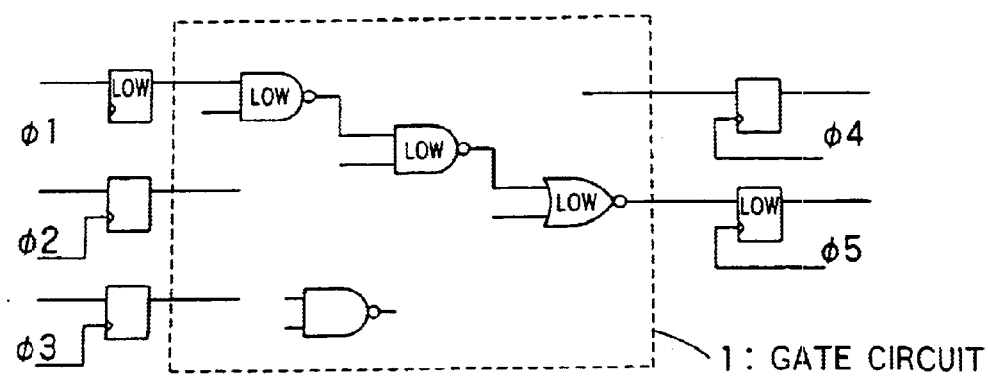
FIG. 10 is a conventional circuit diagram in which only some cells in a logic circuit are replaced with transistors having a low threshold voltage.

In FIG. 1, the gate circuit 1 on the critical path is indicated by oblique lines. The gate circuit 1 indicated by the oblique lines is constituted by an MT gate cell constituted by a transistor having a high threshold voltage (second transistor) and a transistor having a low threshold voltage (first transistor). This MT gate cell may have the circuit structure similar to that in FIG. 9 or a later-described circuit structure.

Each switch circuit 10 for switching whether a power supply voltage is supplied to the MT gate cell is connected to a power supply line of the MT gate cell shown in FIG. 1. This switch circuit 10 is constituted by a PMOS transistor connected to a power supply voltage terminal VDD and an NMOS transistor connected to a ground voltage terminal. Moreover, a control circuit 2 for controlling the switch circuit 10 is provided in the circuit depicted in FIG. 1. The control circuit 2 in FIG. 1 controls ON/OFF of the PMOS transistor and the NMOS transistor within the switch circuit 10 to switch whether the power supply voltage is supplied to the MT gate cell.

Figure 2:
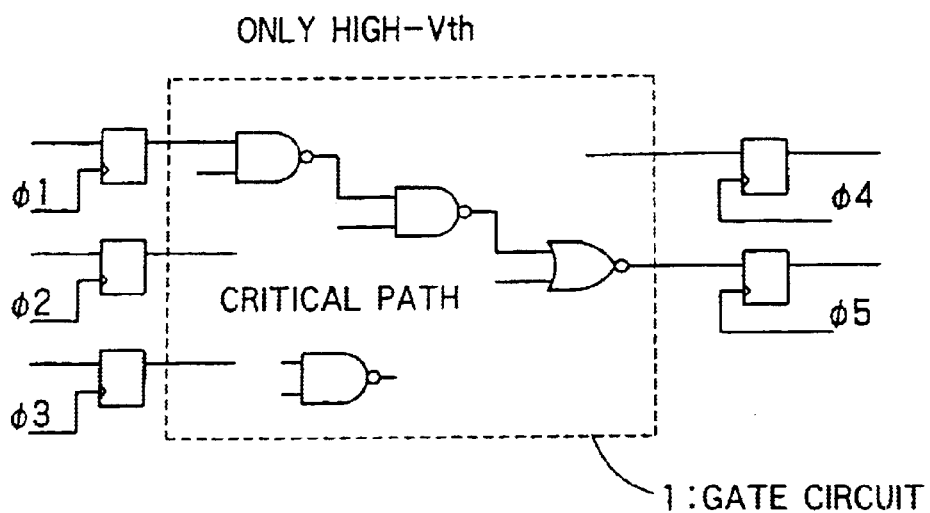
FIG. 2 is a conventional circuit diagram corresponding to the circuit illustrated in FIG. 1.

On the other hand, FIG. 2 is a conventional circuit diagram corresponding to the circuit depicted in FIG. 1. As apparent from FIGS. 1 and 2, the circuit shown in FIG. 1 is different from the circuit illustrated in FIG. 2 in that the MT gate cell substitutes for the gate circuit 1 on the critical path and that the control circuit 2 for switching whether the power is supplied to the MT gate cell is provided.

In case of FIG. 1 circuit, since the gate circuit 1 on the critical path is constituted by the MT gate cell, the signal transmission rate on the critical path can be increased. On the other hand, since any other circuit is constituted by a transistor having a high threshold voltage, the leak electric current can be suppressed in active state.

Figure 3:
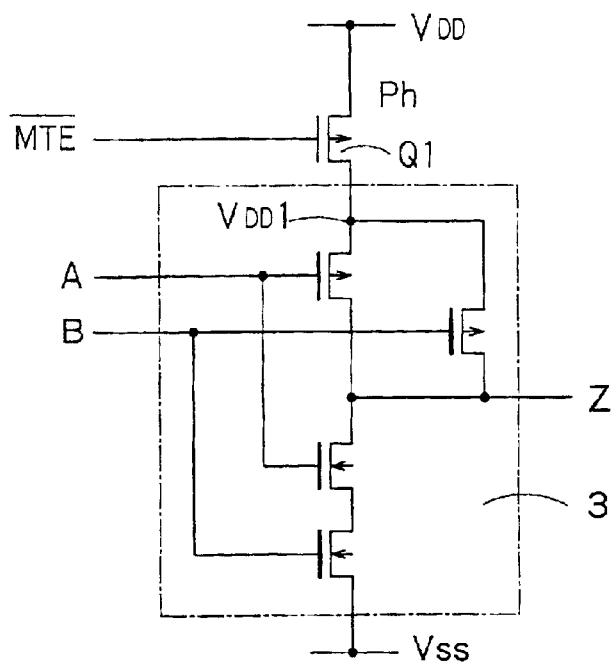
FIG. 3 is a circuit diagram showing a first concrete example of an MT gate cell constituting a gate circuit 1 depicted in FIG. 1.

FIG. 3 is a circuit diagram showing a first concrete example of an MT gate cell constituting the gate circuit 1 of FIG. 1. The circuit of FIG. 3 includes an NAND circuit (gate circuit) 3 composed of transistors having a low threshold voltage, and a transistor (second transistor) Q1 for switching whether the power supply voltage is supplied to the NAND circuit 3. This transistor Q1 is a PMOS transistor having a high threshold voltage.

In case of the circuit illustrated in FIG. 3, when the transistor Q1 is turned on, the power supply voltage is supplied to the NAND circuit 3, and this NAND circuit 3 operates at a high speed. On the other hand, when the transistor Q1 is turned off, the leak path of the NAND circuit 3 is shut off, thereby reducing the leak electric current.

Since the circuit depicted in FIG. 3 has the NAND circuit 3 directly connected to a ground line VSS, the leak path can be assuredly shut off by turning off the transistor Q1 when the NAND circuit 3 is in the standby mode. As a result, the consumption power in the standby mode can be decreased.

Figure 4:
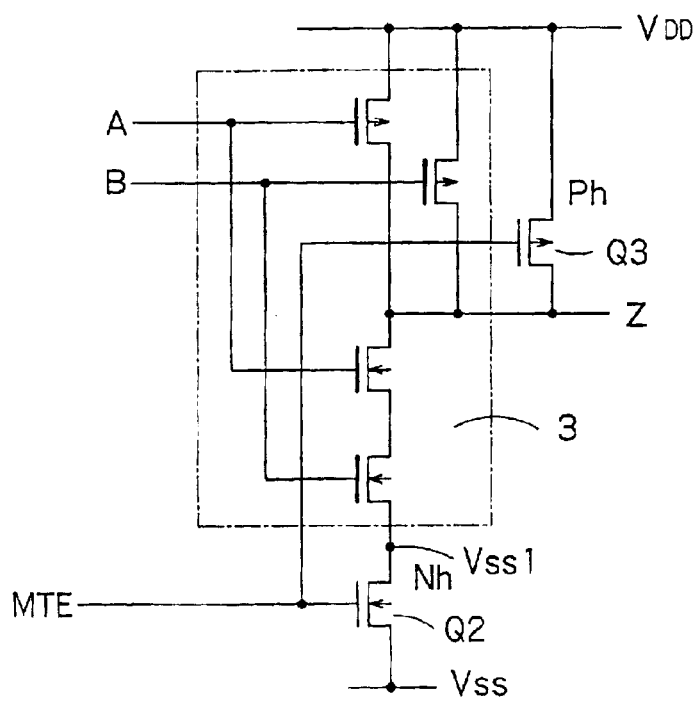
FIG. 4 is a circuit diagram showing a second concrete example of the MT gate cell.

On the other hand, FIG. 4 is a circuit diagram showing a second concrete example of the MT gate cell. The circuit shown in FIG. 4 includes: an NAND circuit (gate circuit) 3 connected between a power supply line VDD and a virtual ground line VSS1, a transistor (second transistor) Q2 connected between the virtual ground line VSS1 and a ground line VSS, and a transistor (third transistor) Q3 connected between an output terminal of the NAND circuit 3 and the power supply line VDD.

The NAND circuit 3 is constituted by transistors having a low threshold voltage, and the transistors Q2 and Q3 are transistors having a high threshold voltage.

In case of the circuit shown in FIG. 4, when one of the transistors Q2 and Q3 is turned on, the other is turned off, and vice versa. When the transistor Q2 is turned on, the power supply voltage is supplied to the NAND circuit 3 and the NAND circuit 3 operates at a high speed. At this moment, since the transistor Q3 is in the OFF state, an output of the NAND circuit 3 is given from its output terminal. On the other hand, when the transistor Q2 is turned off, the leak path of the NAND circuit 3 is shut off, and the NAND circuit 3 enters the stand by mode. At this time, the transistor Q3 is turned on and the output terminal is pulled up to the high level.

In case of the circuit illustrated in FIG. 4, the transistor Q3 is connected to the output terminal of the NAND circuit 3 so that the output logic of the NAND circuit does not become unstable in the standby mode. This prevents the intermediate potential from being propagated to the gate circuit 1 on the rear stage (not shown), and a passing electric current does not flow to the gate circuit 1 on the rear stage.

On the other hand, FIG. 5 is a circuit diagram showing a third concrete example of the MT gate cell. The circuit shown in FIG. 5 includes: an NAND circuit (gate circuit) 3 connected between a virtual power supply line VDD1 and a virtual ground line VSS1, a transistor (second transistor) Q1 connected between the virtual power supply line VDD1 and a power supply line VDD, a transistor (third transistor) Q2 connected between the virtual ground line VSS1 and a ground line VSS, and a data holding circuit (storage circuit) 4 connected to an output terminal of the NAND circuit 3.

The NAND circuit 3 is constituted by transistors having a low threshold voltage, and the transistors Q1 and Q2 are transistors having a high threshold voltage.

The data holding circuit 4 has an inverter 5 connected to the output terminal of the NAND circuit 3, and a clocked inverter 6 connected between an output terminal of the inverter 5 and the output terminal of the NAND circuit 3. The clocked inverter 6 does not perform the data holding operation in the active mode when the transistors Q1 and Q2 are ON, but holds the output logic of the NAND circuit 3 in the standby mode when the transistors Q1 and Q2 are OFF.

In the circuit shown in FIG. 5, since the data is held in the data holding circuit 4 in the standby mode, a passing electric current does not flow to the gate circuit 1 on the rear stage as similar to the circuit in FIG. 4. In addition, since a signal is not propagated at the time of reactivation, the time required for reactivation is short and the consumption power used by reactivation is also small.

Figure 6:
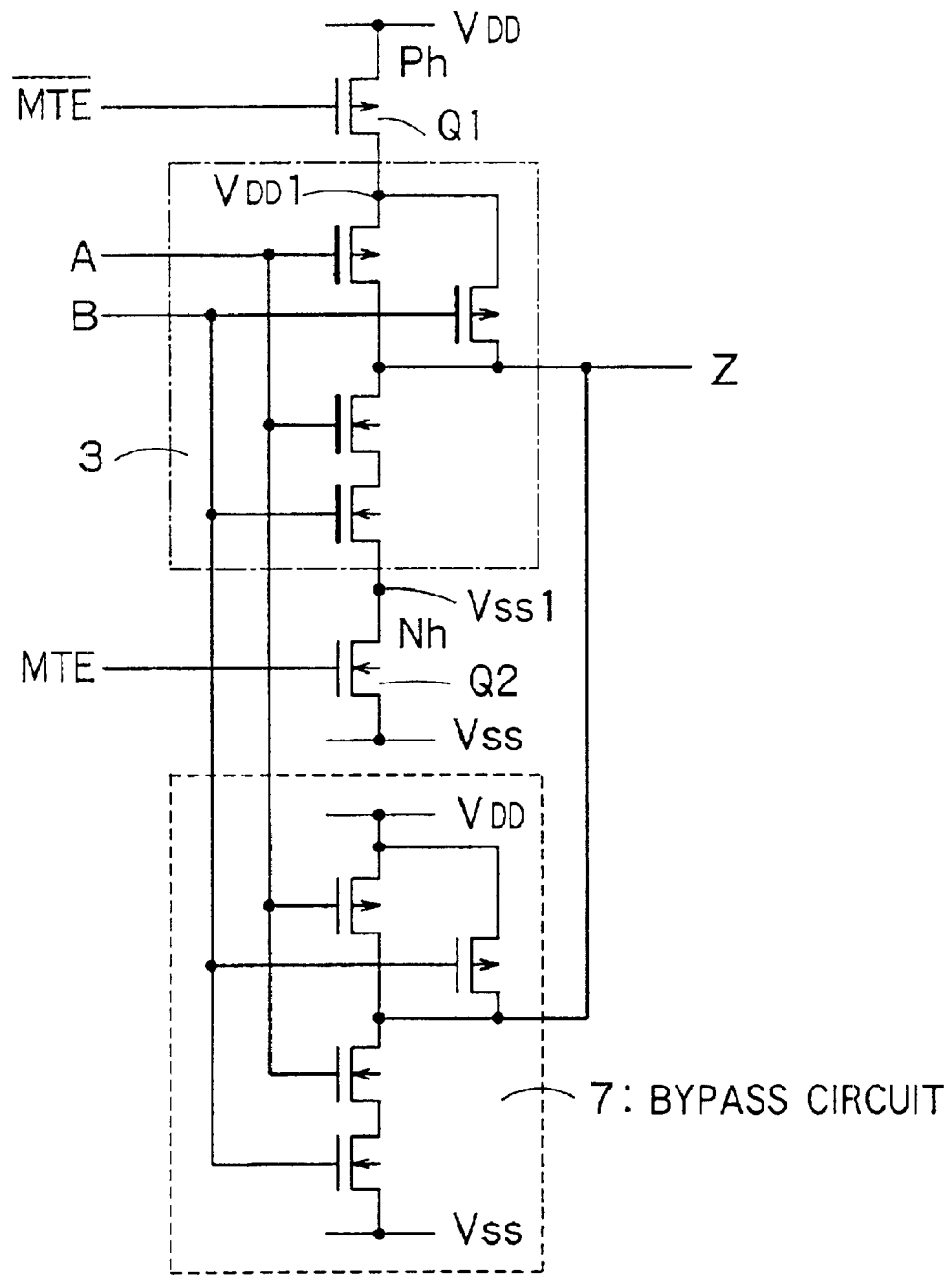
FIG. 6 is a circuit diagram showing a fourth concrete example of the MT gate cell.

On the other hand, FIG. 6 is a circuit diagram showing a fourth concrete example of the MT gate cell. The circuit illustrated in FIG. 6 is similarly constituted as the circuit in FIG. 5 except that a bypass circuit 7 is provided instead of the data holding circuit.

The bypass circuit 7 in FIG. 6 has the same circuit structure as the NAND circuit 3, and is connected between a power supply line VDD and a ground line VSS and connected to the NAND circuit 3 in parallel. However, the NAND circuit 3 is constituted by transistors having a low threshold voltage, whereas the bypass circuit 7 is constituted by transistors having a high threshold voltage.

The NAND circuit 3 becomes active only when the transistors Q1 and Q2 are ON, whereas the bypass circuit 7 is constantly active.

When the transistors Q1 and Q2 are ON, the NAND circuit 3 and the bypass circuit 7 output signals having the same logic. On the other hand, when the transistors Q1 and Q2 are OFF, the NAND circuit 3 does not operate, but the bypass circuit 7 continuously operates, and hence the output logic of the circuit in FIG. 6 does not become unstable. Thus, this prevents the intermediate potential from being propagated to the gate circuit 1 on the rear stage, and the passing electric current does not flow to the gate circuit 1 on the rear stage.

As described above, in the first embodiment, only some gate circuits 1 in the semiconductor integrated circuit (for example, the gate circuit 1 on the critical path) are constituted by the MT gate cells, and any other gate circuits 1 are constituted by transistors having a high threshold voltage. Therefore, only some gate circuits 1 can operate at a high speed, and the overall leak electric current can be suppressed, thereby reducing the consumption power.

Although examples in which the NAND circuit 3 is provided in the MT gate cell have been described with reference to FIGS. 3 to 6, any other gate circuit 1 than the NAND circuit 3 may be provided. However, this embodiment is characterized in that the transistors in the gate circuit having no intermediate node are constituted by transistors having a low threshold voltage.

Figure 7A:
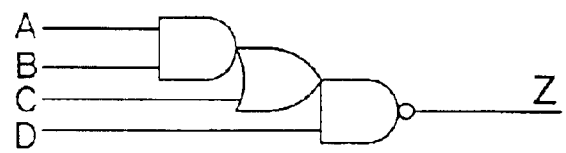
FIG. 7A is a symbol diagram showing a composite gate having no intermediate node.
Figure 7B:
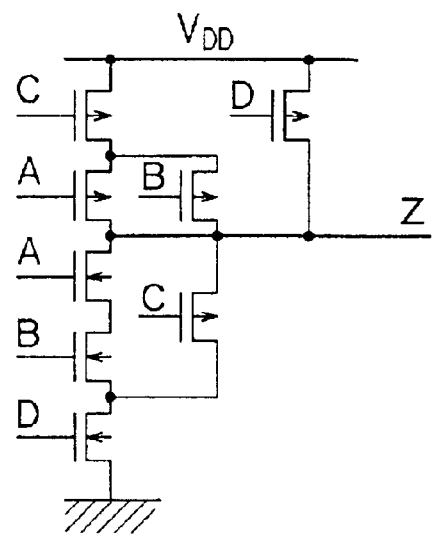
FIG. 7B is an internal circuit diagram of FIG. 7A.

For example, FIG. 7A shows an example of a gate circuit having no intermediate node and depicts a composite gate circuit obtained by combining an AND gate, an OR gate and an NAND gate. As shown in FIG. 7B in detail, the gate circuit shown in FIG. 7A is constituted by PMOS transistors Q4 to Q7 and NMOS transistors Q8 to Q11. Input signals A to D are inputted to respective gate terminals of the transistors Q4 to Q11. Each source/drain terminal of the transistors Q4 to Q11 is connected to a source/drain terminal of another transistor or an output terminal Z. That is, a number of stages that the input signals A to D pass through any gate terminal of the transistors Q4 to Q11 is only one.

Since the threshold voltage of the transistors constituting such a gate circuit having no intermediate node within the MT gate cell as shown in FIG. 7A is set lower than the threshold voltage of the transistors constituting other circuits, only this gate circuit can be driven at a high speed.

Incidentally, as the gate circuit having no intermediate node, various kinds of composite gate circuits such as shown in FIG. 7A can be considered besides basic NAND circuits or NOR circuits.

Second Embodiment

A second embodiment constitutes some gate circuits 1 in a flip flop are constituted by MT gate cells.

Figure 8:
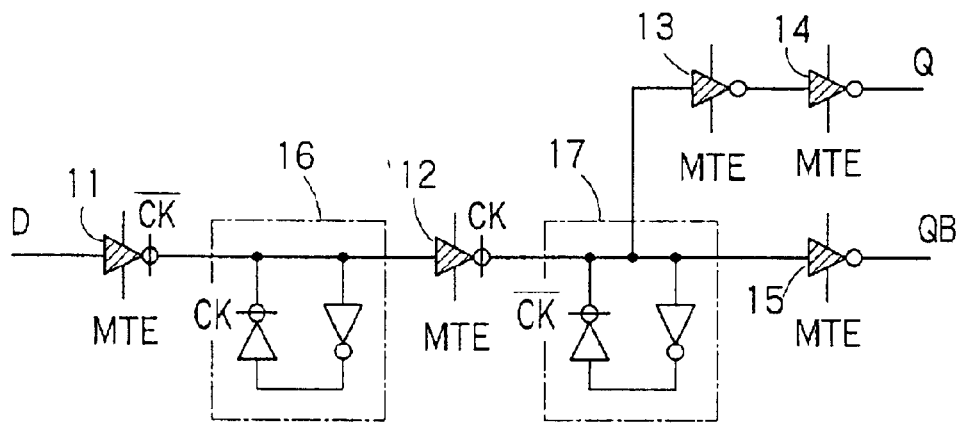
FIG. 8 is a circuit diagram showing a second embodiment of a semiconductor integrated circuit according to the present invention.

FIG. 8 is a circuit diagram showing a second embodiment of a semiconductor integrated circuit according to the present invention. The semiconductor integrated circuit shown in FIG. 8 is a D flip flop, and this D flip flop is constituted by clocked inverters (first and second conduction interception circuits) 11 and 12 consisting of MT gate cells, inverters 13 to 15, and storage circuits (first and second storage circuits) 16 and 17 consisting of transistors having a high threshold value. The storage circuits 16 and 17 are constituted by the inverters and the clocked inverters as similar to the data holding circuit 4 shown in FIG. 5.

The storage circuits 16 and 17 in the flip flop are used for holding the output logic of the clocked inverter on a preceding stage and rarely affect the operation speed of the flip flop. Therefore, in this embodiment, the storage circuit is constituted by transistors having a high threshold value, thereby reducing the leak electric current.

On the other hand, the clocked inverters 11 and 12 and the inverters 13 to 15 in the flip flop are constituted by the MT gate cells as similar to FIGS. 3 to 6. Since the clocked inverters 11 and 12 and the inverters 13 to 15 function to transmit signals, the operation speed of the flip flop can be improved by constituting these inverters by the MT gate cells.

As described above, in the second embodiment, among a plurality of circuits constituting the flip flop, since only the clocked inverters 11 and 12 and the inverters 13 to 15 which affect the operation speed are formed by the MT gate cells and any other circuits are constituted by transistors having a high threshold voltage, the operation speed of the flip flop can be improved while the leak electric current can be reduced.

Incidentally, although an example in which the D flip flop is constituted has been described with reference to FIG. 8, the present invention can be similarly applied to various kinds of flip flops other than the D flip flop. For example, although the inverters 13 to 15 are connected to the rear stage of the storage circuit 17, any circuit other than the inverters may be connected to the rear stage of the storage circuit 17.

Further, the circuit structure of the storage circuits 16 and 17 is not restricted to a specific type. For example, inverters may substitute for the clocked inverters in the storage circuits 16 and 17.

What is claimed is:

1. A semiconductor integrated circuit comprising:

a plurality of gate circuits; and a control circuit configured to control the operation of two or more gate circuits among said plurality of gate circuits, each of said two or more gate circuits controlled by said control circuit, said control circuit including, a logic circuit constituted by a plurality of first transistors, and a switch circuit which includes second and third transistors controlled to turn on/off by said control circuit, each having a threshold voltage higher than that of each of said first transistors and conductive types different from each other, said switch circuit being capable of cut off said logic circuit from a power supply line by simultaneously turning off said second and third transistors;

wherein said two or more gate circuits controlled by the plurality of first transistors are provided on a critical path.

2. A logic operation circuit comprising:

a gate circuit which is connected between a first reference voltage line and a virtual voltage line and constituted by a plurality of first transistors;

a second transistor which is connected between said virtual voltage line and a second reference voltage line and has a threshold voltage higher than that of each of said first transistors; and a third transistor which is connected between said first reference voltage line and an output terminal of said gate circuit and has a threshold voltage higher than that of each of said first transistors, said second and third transistors being on/off-controlled in such a manner that one of them is turned on while the other is turned off and vice versa.

3. The logic operation circuit according to claim 2, wherein a source/drain terminal of said first transistor in said gate circuit is connected to either a source/drain terminal of another first transistor in said gate circuit or an output terminal of said gate circuit.

4. A semiconductor integrated circuit, wherein said logic operation circuit defined in claim 2 is provided on a critical path.

5. A logic operation circuit comprising:

a gate circuit which is constituted by a plurality of first transistors and connected to first and second virtual voltage lines;

a second transistor which is connected between a first reference voltage line and said first virtual voltage line and has a threshold voltage higher than each of said first transistors;

a third transistor which is connected between a second reference voltage line and said second virtual voltage line and has a threshold voltage higher than that of each of said first transistors; and a storage circuit capable of holding output logic of said gate circuit, said storage circuit being composed of transistors having threshold voltages higher than that of each of said first transistors, said second and third transistors being controlled to be OFF when said storage circuit holds said output logic of said gate circuit, and said second and third transistors being controlled to be ON when said storage circuit does not hold said output logic of said gate circuit.

6. The logic operation circuit according to claim 5, wherein a source/drain terminal of said first transistor in said gate circuit is connected to a source/drain terminal of another first transistor in said gate circuit, to said second reference voltage line circuit or an output terminal of said gate circuit.

7. A logic operation circuit comprising:

a gate circuit which is constituted by a plurality of first transistors and connected to first and second virtual voltage lines;

a second transistor which is connected between a first reference voltage line and said first virtual voltage line and has a threshold voltage higher than that of each of said first transistors;

a third transistor which is connected between a second reference voltage line and said second virtual voltage line and has a threshold voltage higher than that of each of said first transistors; and a bypass circuit which is connected to said gate circuit in parallel and constituted by a circuit substantially equal to said gate circuit by using a plurality of fourth transistors having a threshold voltage higher than that of each of said first transistors, said bypass circuit being connected between said first and second reference voltage lines.

8. A semiconductor integrated circuit, wherein said logic operation circuit defined in claim 7 is provided on a critical path.

9. A semiconductor integrated circuit, wherein said logic operation circuit defined in claim 7 is provided on a critical path.

10. A semiconductor integrated circuit, wherein said logic operation circuit defined in claim 7 is provided on a critical path.

11. A flip flop comprising:
a first conduction interception circuit capable of switching conduction or shutoff between an input terminal and an output terminal;
a first storage circuit capable of holding output logic of said first conduction interception circuit;
a second conduction interception circuit which is capable of switching conduction or shutoff between an input terminal and an output terminal and has said input terminal being connected to an output terminal of said first storage circuit; and
a second storage circuit capable of holding output logic of said second conduction interception circuit,
said first and second conduction interception circuits being constituted by said logic operation circuits defined in claim 7,
said first and second storage circuits being constituted by transistors having a threshold voltage higher than those of said gate circuits in said first and second conduction interception circuits.

12. A flip flop comprising:
a first conduction interception circuit capable of switching conduction or shutoff between an input terminal and an output terminal;
a first storage circuit capable of holding output logic of said first conduction interception circuit;
a second conduction interception circuit which is capable of switching conduction or shutoff between an input terminal and an output terminal and has said input terminal being connected to an output terminal of said first storage circuit; and
a second storage circuit capable of holding output logic of said second conduction interception circuit,
said first and second conduction interception circuits includes:
a gate circuit which is connected between a first reference voltage line and a virtual voltage line and constituted by a plurality of first transistors;
a second transistor which is connected between said virtual voltage line and a second reference voltage line and has a threshold voltage higher than that of each of said first transistors; and
a third transistor which is connected between said first reference voltage line and an output terminal of said gate circuit and has a threshold voltage higher than that of each of said first transistors,
said second and third transistors being on/off-controlled in such a manner that one of them is turned on while the other is turned off and vice versa, and
said first and second storage circuits being constituted by transistors having a threshold voltage higher than those of said gate circuits in said first and second conduction interception circuits.

13. A flip flop comprising:
a first conduction interception circuit capable of switching conduction or interception between an input terminal and an output terminal;
a first storage circuit capable of holding output logic of said first conduction interception circuit;
a second conduction interception circuit which is capable of switching conduction or interception between an input terminal and an output terminal and has said input terminal being connected to an output terminal of said first storage circuit;
and a second storage circuit capable of holding output logic of said second conduction interception circuit,
said first and second conduction interception circuits includes:
a gate circuit which is constituted by a plurality of first transistors and connected to first and second virtual voltage lines;
a second transistor which is connected between a first reference voltage line and said first virtual voltage line and has a threshold voltage higher than each of said first transistors;
a third transistor which is connected between a second reference voltage line and said second virtual voltage line and has a threshold voltage higher than that of each of said first transistors; and
a storage circuit capable of holding output logic of said gate circuit, said storage circuit being composed of transistors having threshold voltage higher than that of said first transistor,
said second and third transistors being controlled to be OFF when said storage circuit holds said output logic of said gate circuit, and said second and third transistors being controlled to be ON when said storage circuit does not hold said output logic of said gate circuit, and
said first and second storage circuits being constituted by transistors having a threshold voltage higher than those of said gate circuits in said first and second conduction interception circuits.

* * * * *